US012751274B2

(12) United States Patent
Shinohara

(10) Patent No.: US 12,751,274 B2
(45) Date of Patent: Sep. 29, 2026

(54) SEMICONDUCTOR INTEGRATED CIRCUIT DEVICE

(71) Applicant: Socionext Inc., Kanagawa (JP)

(72) Inventor: Hayato Shinohara, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 352 days.

(21) Appl. No.: 18/609,760

(22) Filed: Mar. 19, 2024

(65) Prior Publication Data

US 2024/0234322 A1 Jul. 11, 2024

Related U.S. Application Data

(63) Continuation of application No. PCT/JP2021/035637, filed on Sep. 28, 2021.

(51) Int. Cl.

| | |
|---|---|
| ***H01L 23/528*** | (2006.01) |
| ***H01L 27/118*** | (2006.01) |
| ***H10D 84/90*** | (2025.01) |
| ***H10W 20/41*** | (2026.01) |

(52) U.S. Cl.
CPC ........ *H10W 20/427* (2026.01); *H10D 84/903* (2025.01)

(58) Field of Classification Search
CPC . H10W 20/427; H10D 84/903; H10D 84/907; H10D 89/10
USPC .......................................................... 257/207
See application file for complete search history.

(56) References Cited

U.S. PATENT DOCUMENTS

| | | | |
|---|---|---|---|
| 10,170,413 B2 | 1/2019 | Ohtou et al. | |
| 2018/0151494 A1 | 5/2018 | Ohtou et al. | |
| 2018/0197788 A1* | 7/2018 | Anderson | H10D 30/63 |
| 2021/0336001 A1* | 10/2021 | Yang | G06F 30/392 |
| 2022/0293634 A1 | 9/2022 | Okamoto et al. | |
| 2022/0336499 A1 | 10/2022 | Komuro et al. | |

FOREIGN PATENT DOCUMENTS

| | | |
|---|---|---|
| JP | 2009-16683 A | 1/2009 |
| WO | 2021/075353 A1 | 4/2021 |
| WO | 2021/111604 A1 | 6/2021 |

OTHER PUBLICATIONS

International Search Report dated Nov. 16, 2021 issued in International Patent Application No. PCT/JP2021/035637, with English translation.
Office Action issued in corresponding Japanese Patent Application No. 2023-550789, dated Jul. 22, 2025 with its partial English translation.

* cited by examiner

*Primary Examiner* — Tong-Ho Kim
(74) *Attorney, Agent, or Firm* — Rimon P.C.

(57) ABSTRACT

In a semiconductor integrated circuit device, a plurality of standard cells arranged in an X direction include a first standard cell having a logical function and including a transistor having a channel portion extending in the X direction, and a second standard cell including a signal line placed to extend in the X direction. The signal line is formed in a buried interconnect layer, and has an overlap with the channel portion at a position in a Y direction.

6 Claims, 7 Drawing Sheets

SEMICONDUCTOR INTEGRATED CIRCUIT DEVICE

CROSS-REFERENCE TO RELATED APPLICATIONS

This is a continuation of International Application No. PCT/JP2021/035637 filed on Sep. 28, 2021. The entire disclosure of this application is incorporated by reference herein.

BACKGROUND

The present disclosure relates to a semiconductor integrated circuit device provided with standard cells.

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

Also, for higher integration of a semiconductor integrated circuit device, it is proposed to use, for standard cells, buried power rails (BPRs) that are power lines laid in a buried interconnect layer, not power lines laid in a metal interconnect layer formed above transistors as conventionally done.

U.S. Pat. No. 10,170,413 (FIG. 2C) discloses a configuration in which a buried interconnect layer is used not only for laying power lines but also for laying signal lines. To state specifically, a standard cell includes Pch and Nch fin transistors, and signal lines laid in a buried interconnect layer, i.e., buried signal lines, are provided between the Pch fin transistor and the Nch fin transistor.

Both the fin transistors and the buried signal lines are formed in a substrate. For this reason, it is unable to lay buried signal lines in a region in which fin transistors are placed. In the technique disclosed in the cited document, therefore, the number of signal lines capable of being laid in the buried interconnect layer is small. In order to lay many signal lines in the buried interconnect layer, it is required to increase the area of the standard cell. This results in increasing the area of the semiconductor integrated circuit device.

An objective of the present disclosure is providing a semiconductor integrated circuit device having a buried interconnect layer, in which many buried signal lines can be laid without causing an increase in area.

SUMMARY

According to a mode of the present disclosure, a semiconductor integrated circuit device includes a plurality of standard cells arranged in a first direction, wherein the plurality of standard cells include a first standard cell having a logical function and including a transistor having a channel portion extending in the first direction, and a second standard cell including a signal line placed to extend in the first direction, and the signal line is formed in a buried interconnect layer, and has an overlap with the channel portion at a position in a second direction perpendicular to the first direction.

According to the above mode, in a semiconductor integrated circuit device, a plurality of standard cells including a first standard cell having a logical function and a second standard cell are arranged in the first direction. The first standard cell includes a transistor having a channel portion extending in the first direction, and the second standard cell includes a signal line placed to extend in the first direction. The signal line in the second standard cell is formed in a buried interconnect layer, and has an overlap at a position in the second direction with the channel portion of the transistor in the first standard cell. With this configuration, many signal lines can be laid in the buried interconnect layer without causing an increase in the area of the semiconductor integrated circuit device.

According to the present disclosure, in a semiconductor integrated circuit device, many buried signal lines can be laid without causing an increase in area.

BRIEF DESCRIPTION OF THE DRAWINGS

FIGS. 1A-1C show layout examples of standard cells in an embodiment, in which FIG. 1A shows an inverter cell, FIG. 1B shows a cell for buried signal lines, and FIG. 1C shows an example of laying buried signal lines in the cell for buried signal lines.

DETAILED DESCRIPTION

An embodiment of the present disclosure will be described hereinafter with reference to the accompanying drawings. In the disclosure, "VDD" and "VSS" indicate power supply voltages or power supplies themselves. Also, hereinafter, in the plan views such as FIGS. 1A-1C, the horizontal direction in the figure is called an X direction (corresponding to the first direction) and the vertical direction in the figure is called a Y direction (corresponding to the second direction).

Figure 1C:
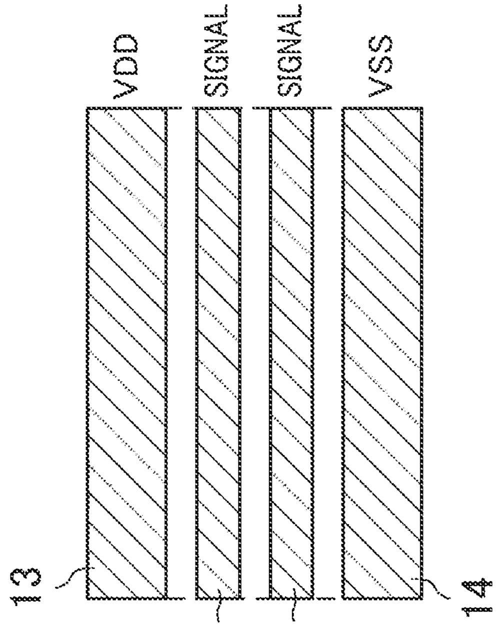
Figure 1B:
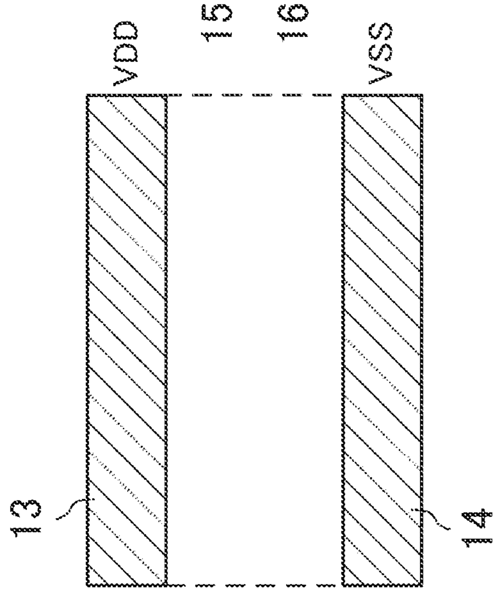
Figure 1B:
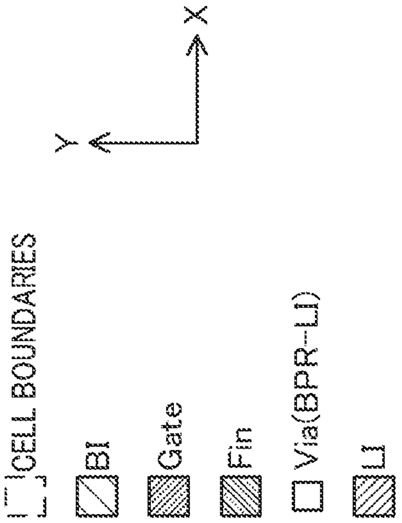
Figure 1A:
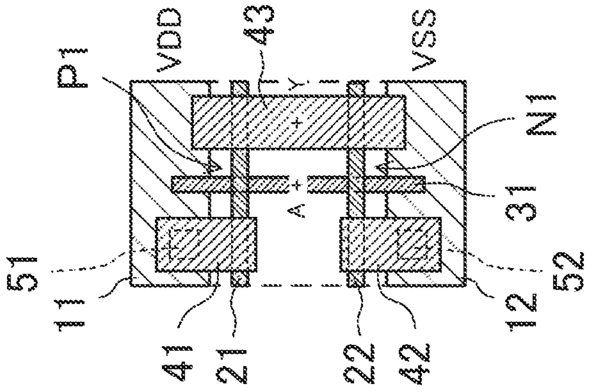

FIGS. 1A-1C show layout examples of standard cells in the embodiment, in which FIG. 1A shows an inverter cell, FIG. 1B shows a cell for buried signal lines, and FIG. 1C shows an example of laying buried signal lines in the cell for buried signal lines.

Figure 2:
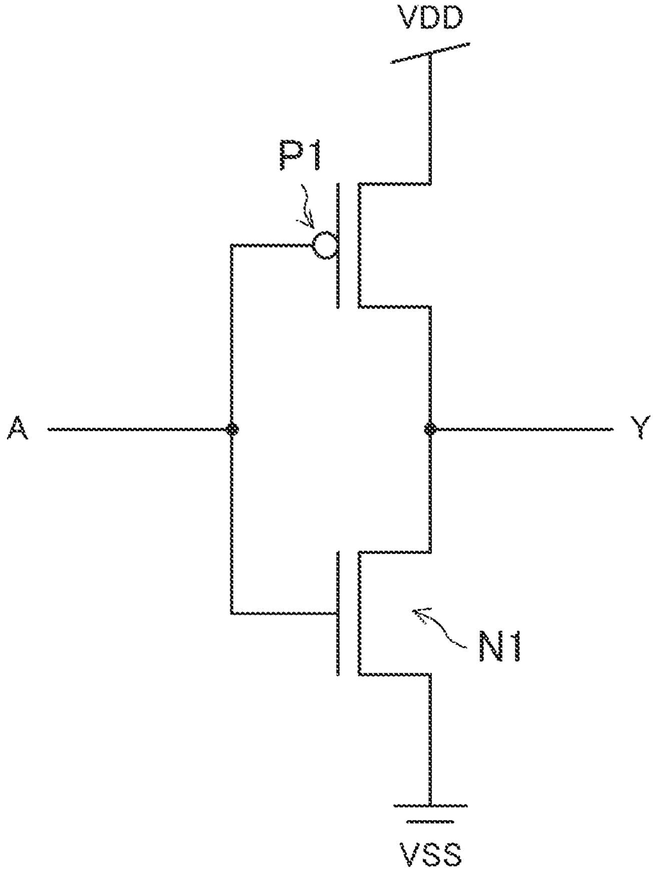
FIG. 2 is a circuit diagram of an inverter.

FIG. 2 is a circuit diagram of an inverter implemented by the inverter cell shown in FIG. 1A. As shown in FIG. 2, the inverter includes a Pch transistor P1 and an Nch transistor N1 and has an input A and an output Y.

In the inverter cell shown in FIG. 1A, power lines 11 and 12 extending in the X direction are provided in both end portions in the Y direction. The power lines 11 and 12 are both buried power rails (BPR) formed in a buried interconnect layer (BI). The power line 11 supplies the power supply voltage VDD and the power line 12 supplies the power supply voltage VSS.

A fin 21 extending in the X direction is provided in a p-type transistor region on an N-well, and a fin 22 extending in the X direction is provided in an n-type transistor region on a P-substrate. A gate interconnect 31 extends in the Y direction across the p-type transistor region and the n-type transistor region.

The gate 31 is formed to surround the fins 21 and 22 on three sides of the fins. The fin 21 and the gate interconnect 31 constitute the fin field effect transistor (FET) P1. The fin 22 and the gate interconnect 31 constitute the fin FET N1. The fin 21 is the channel portion of the fin FET P1, and the fin 22 is the channel portion of the fin FET N1. The fin 21 is spaced from the power line 11 in planar view, and the fin 22 is spaced from the power line 12 in planar view.

A local interconnect (LI) 41 extending in the Y direction is provided on a left end portion of the fin 21 in the figure. The left end portion of the fin 21 is connected to the power line 11 through the local interconnect 41 and a via 51. A local interconnect (LI) 42 extending in the Y direction is provided on a left end portion of the fin 22 in the figure. The left end portion of the fin 22 is connected to the power line 12 through the local interconnect 42 and a via 52. A local interconnect 43 extending in the Y direction is provided on right end portions of the fins 21 and 22. The right end portions of the fins 21 and 22 are mutually connected through the local interconnect 43.

A metal interconnect (not shown) through which the input A is given is connected to the gate interconnect 31 through a via, and a metal interconnect (not shown) through which the output Y is output is connected to the local interconnect 43 through a via.

The inverter cell shown in FIG. 1A is an example of standard cells having individual logical functions (hereinafter simply referred to as logic cells as appropriate). The logic cells are in charge of the logic of the semiconductor integrated circuit device. Examples of such logic cells include, in addition to the inverter cell, a NAND cell, a NOR cell, and a flipflop. These cells other than the inverter cell also have fin FETs, provided with fins, as in FIG. 1A.

While one fin is placed for each of the p-type transistor region and the n-type transistor region in the layout of FIG. 1A, two or more fins may be formed.

In the cell for buried signal lines shown in FIG. 1B, power lines 13 and 14 extending in the X direction are provided in both end portions in the Y direction. The power lines 13 and 14 are both buried power rails (BPR) formed in the buried interconnect layer (BI). The power line 13 supplies the power supply voltage VDD and the power line 14 supplies the power supply voltage VSS. The region between the power line 13 and the power line 14 is empty with no fin formed.

The power line 13 is placed at the same position in the Y direction, and with the same width, as the power line 11. The power line 14 is placed at the same position in the Y direction, and with the same width, as the power line 12. With this, when the logic cell such as the inverter cell shown in FIG. 1A and the cell for buried signal lines shown in FIG. 1B are placed side by side in the X direction, the power line supplying VDD will continue in the X direction and the power line supplying VSS will continue in the X direction.

In FIG. 1C, signal lines 15 and 16 extending in the X direction are placed in the region between the power line 13 and the power line 14. The signal lines 15 and 16 are formed in the buried interconnect layer. Since no fin is formed in the region between the power line 13 and the power line 14 in the cell for buried signal lines, many signal lines can be laid in the buried interconnect layer.

When the inverter cell shown in FIG. 1A and the cell for buried signal lines shown in FIG. 1C are placed side by side in the X direction, the fin 21 and the signal line 15 has an overlap with each other at a position in the Y direction, and the fin 22 and the signal line 16 has an overlap with each other at a position in the Y direction.

Note that the cell width (size in the X direction) of the cell for buried signal lines is not limited to that in FIGS. 1B and 1C. Note also that a cell layout having the signal lines 15 and 16 already placed, such as that shown in FIG. 1C, may be prepared in advance as the cell for buried signal lines. The number of signal lines laid in the cell for buried signal lines is not limited to two, but three or more may be laid.

Figure 3:
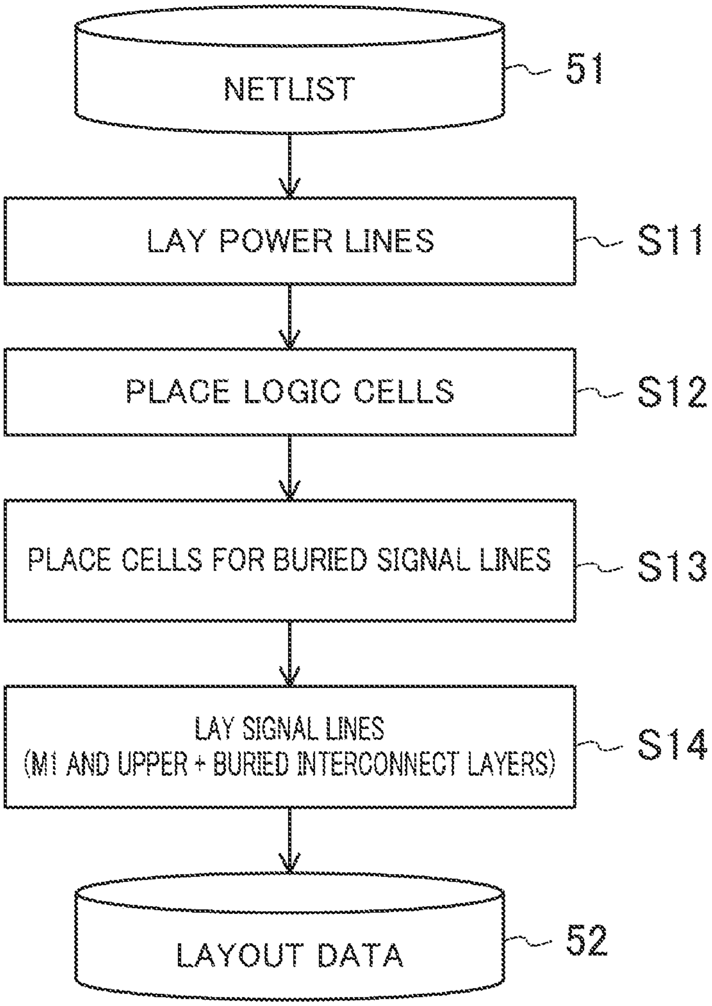
FIG. 3 shows a design flow example of a semiconductor integrated circuit device in the embodiment.

FIG. 3 shows a design flow example of the semiconductor integrated circuit device in the embodiment. This design flow is executed by a computer that executes a design program. The input into the computer is netlist data 51 that describes logic cells to constitute a desired circuit and connections between them, and the output from the computer is layout data 52 to implement the desired circuit.

In step S11, strap power lines running in the Y direction are laid in an interconnect layer located above a region in which standard cells are placed, and interconnects and contacts are placed so that the laid strap power lines be connected to buried power lines in the standard cells. In step S12, logic cells to constitute the desired circuit are placed. In step S13, cells for buried signal lines are placed in regions in which no logic cell is placed. In step S14, interconnects between the logic cells for implementing a logic circuit are laid. As signal interconnect layers, a buried interconnect layer is used in addition to M1 and upper interconnect layers. Signal lines in the buried interconnect layer are laid in the cells for buried signal lines placed in step S13.

Figure 4:
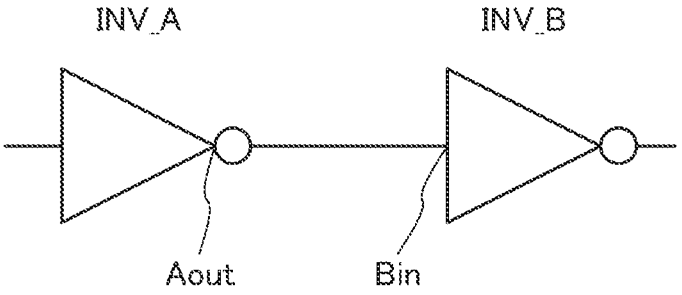
FIG. 4 shows a circuit example to be designed.

An example of performing layout design for a circuit of FIG. 4 will be described. The circuit of FIG. 4 includes two inverters INV_A and INV_B. The output Y (Aout node) of the inverter INV_A is connected to the input A (Bin node) of the inverter INV_B.

Figure 5:
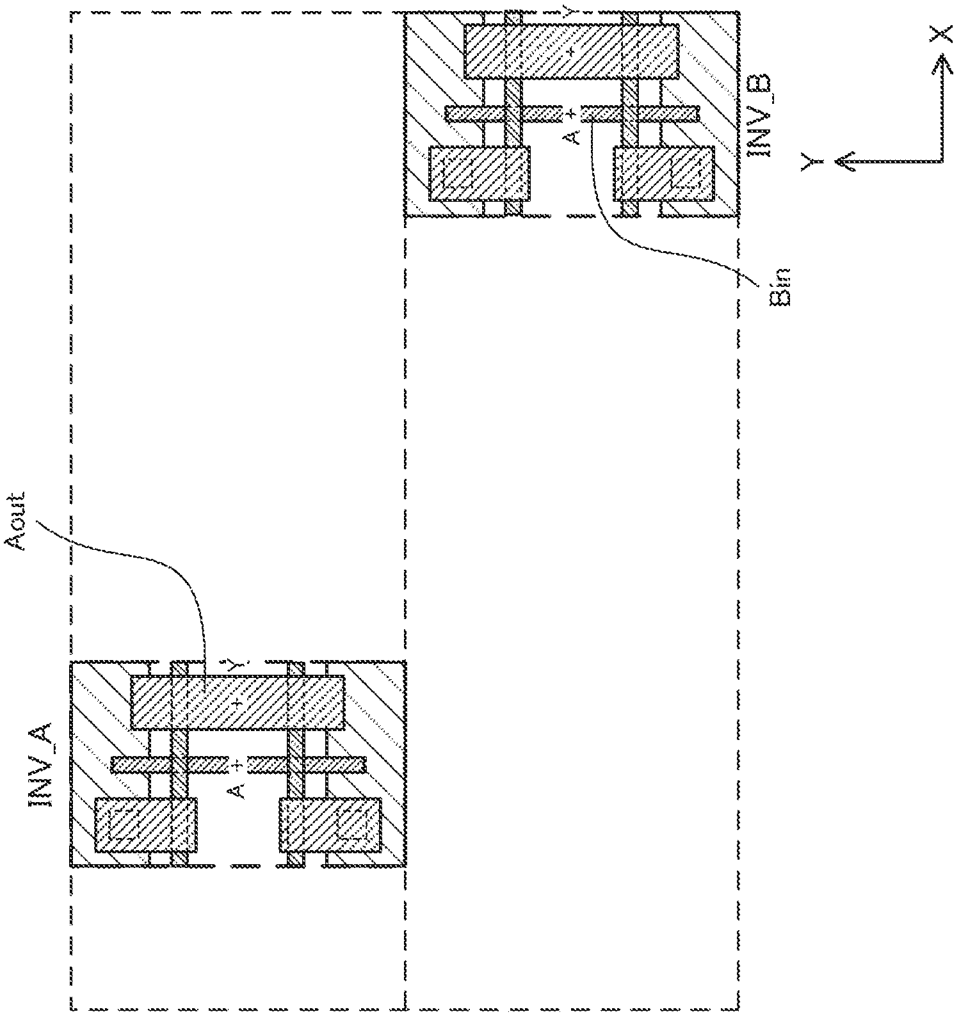
FIG. 5 shows an example of execution of placing logic cells in the embodiment.

FIG. 5 shows an example of execution of the step S12 of placing logic cells. In FIG. 5, a standard cell as the inverter INV_A is placed in the upper row in the figure, and a standard cell as the inverter INV_B is placed in the lower row in the figure.

Figure 6:
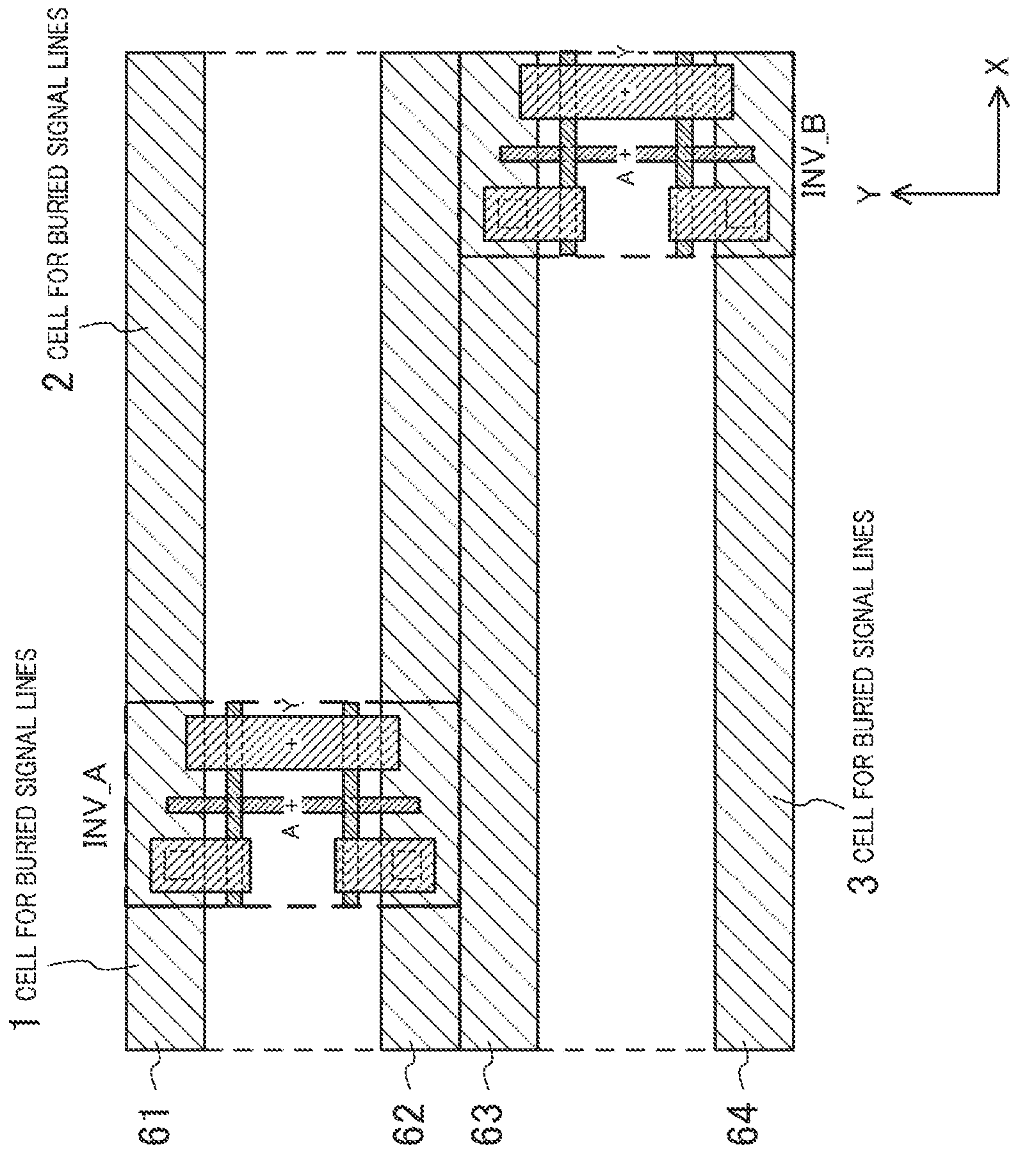
FIG. 6 shows an example of execution of placing cells for buried signal lines in the embodiment.

FIG. 6 shows an example of execution of the step S13 of placing cells for buried signal lines. In FIG. 6, cells 1, 2, and 3 for buried signal lines are placed in the empty regions in FIG. 5. The cell widths of the cells 1, 2, and 3 for buried signal lines, which are different from one another, correspond to the sizes of the empty regions in the X direction. With the placement of the cells 1, 2, and 3 for buried signal lines, power lines 61, 62, 63, and 64 extending in the X direction are formed. Since no fins have been placed in the cells 1, 2, and 3 for buried signal lines, buried signal lines can be laid at the same Y coordinate positions as the fins of the logic cells.

Figure 7:
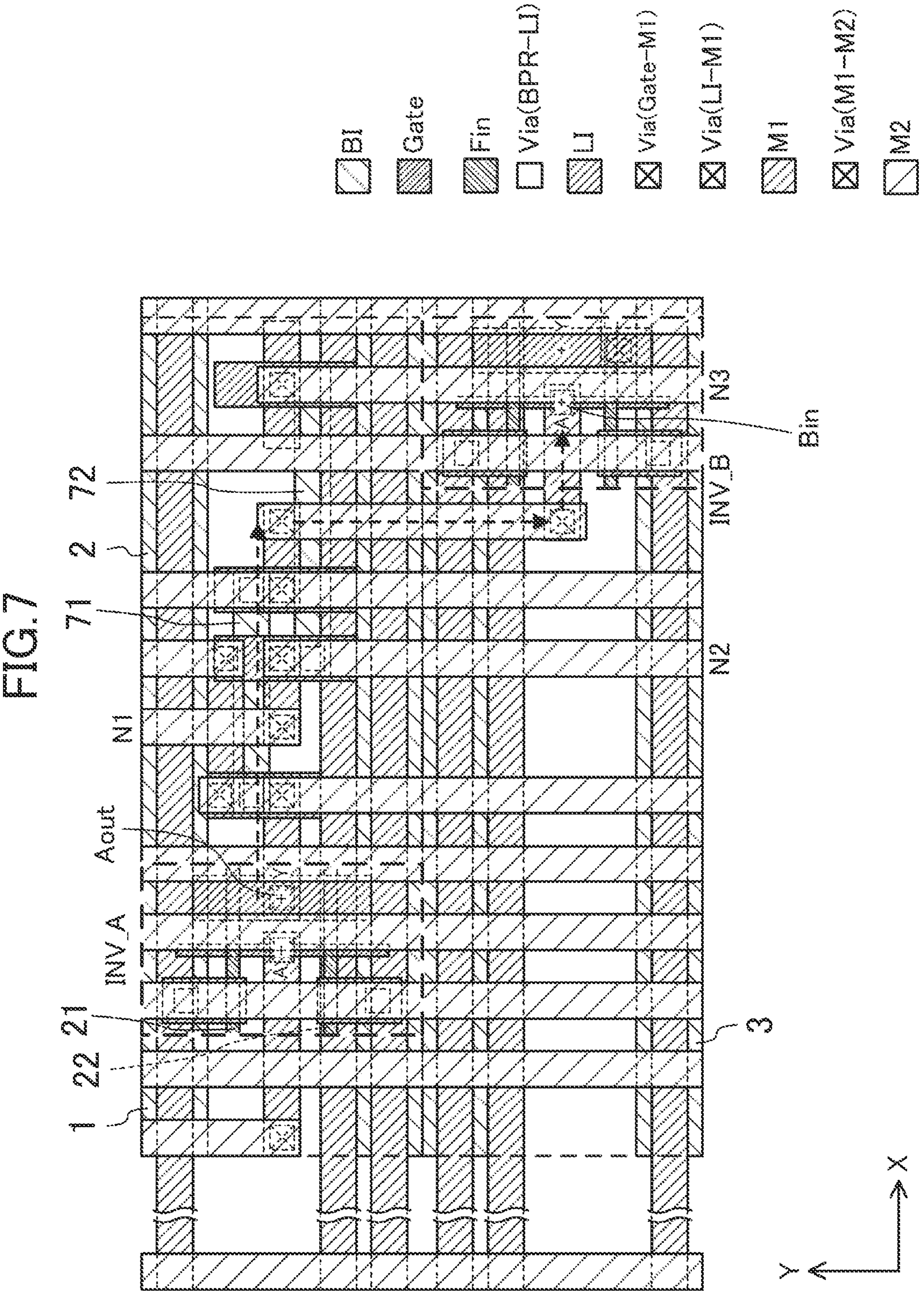
FIG. 7 shows an example of execution of laying signal lines in the embodiment.

FIG. 7 shows an example of execution of the step S14 of placing signal lines. In FIG. 7, signal lines are placed with respect to the cell placement in FIG. 6. As signal interconnect layers, the buried interconnect layer is used in the cells for buried signal lines, in addition to an M1 interconnect layer and an M2 interconnect layer. Also, a local interconnect layer is used as a relay between the buried interconnect layer and the M1 interconnect layer. The M1 interconnect layer is located above the local interconnect layer, and the M2 interconnect layer is located above the M1 interconnect layer.

To state specifically, a buried signal line 71 is used in a signal path connecting the Aout node of the inverter INV_A and the Bin node of the inverter INV_B. The buried signal line 71 is placed at a position overlapping in the Y direction with the fin 21 of the inverter INV_A.

Also, signal paths branching from an M2 interconnect N1 to an M2 interconnect N2 and to an M2 interconnect N3 are formed. A buried signal line 72 is used in the signal path from the M2 interconnect N1 to the M2 interconnect N3. The buried signal line 72 is placed at a position overlapping in the Y direction with the fin 22 of the inverter INV_A.

Figure 8:
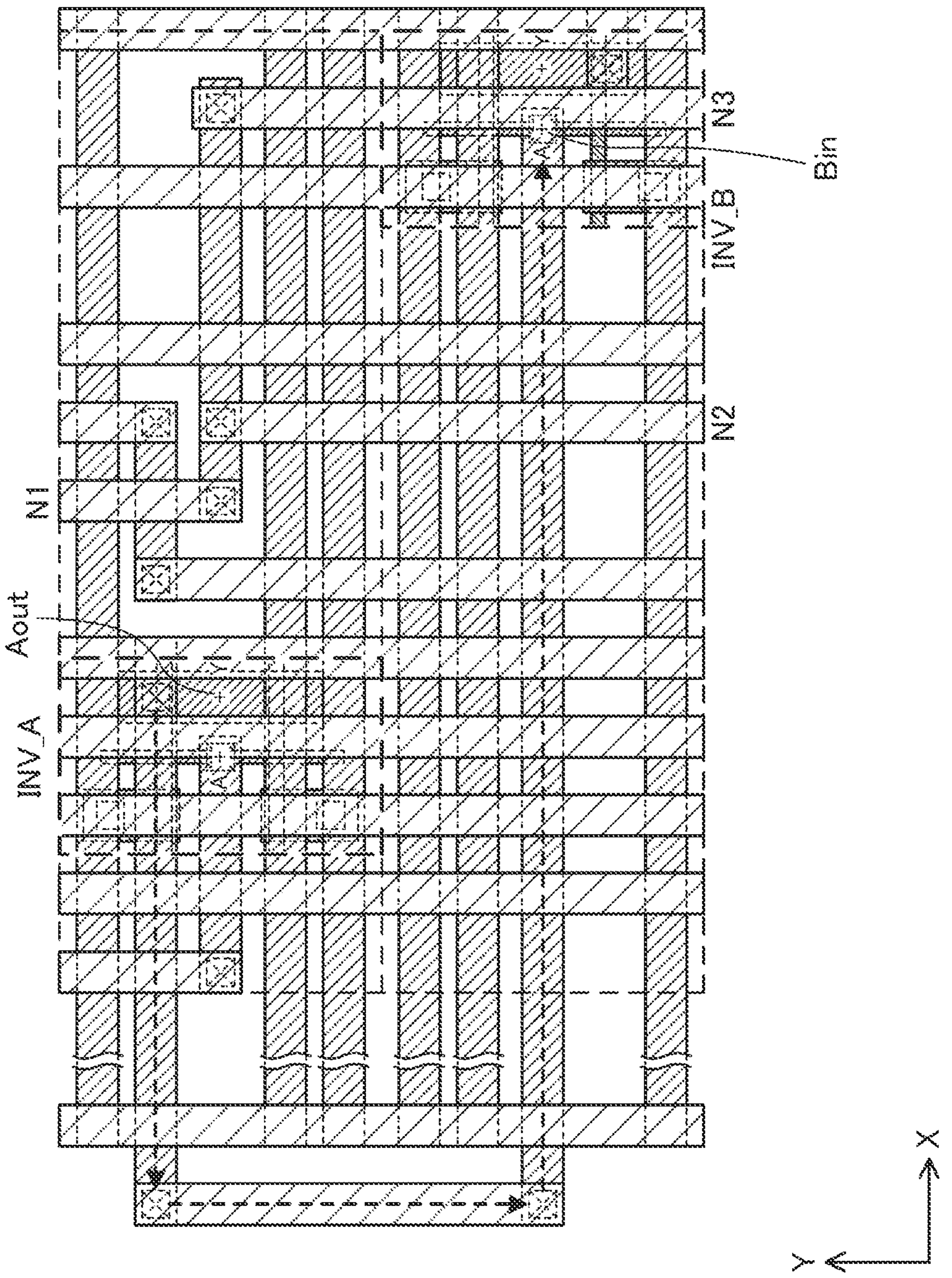
FIG. 8 shows an example of laying signal lines as a contrast example.

FIG. 8 shows an example of placing signal lines when no buried signal line is used, as a contrast example. As shown in FIG. 8, when no buried signal line is used, it is necessary to largely detour signal lines in the signal path connecting the Aout node of the inverter INV_A and the Bin node of the inverter INV_B (see the arrows in the figure). This decreases the routing density, thereby increasing the area of the semiconductor integrated circuit device, and also increases the routing length, thereby degrading the performance of the semiconductor integrated circuit device.

In contrast to the above, according to this embodiment, the buried signal line 71 in the cell 2 for buried signal lines can be used in the signal path connecting the Aout node of the inverter INV_A and the Bin node of the inverter INV_B. Also, the buried signal line 72 in the cell 2 for buried signal lines can be used in the signal path from the M2 interconnect N1 to the M2 interconnect N3. The buried signal line 71 has an overlap with the fin 21 at a position in the Y direction, and the buried signal line 72 has an overlap with the fin 22 at a position in the Y direction. This can improve the routing density, and therefore can achieve reduction in the area of the semiconductor integrated circuit device. Also, since the routing length can be reduced, higher-speed operation of the semiconductor integrated circuit device can be achieved. In particular, since a larger number of buried signal lines can be laid in the cells for buried signal lines in which no fin is provided, the above-described effects are more enhanced.

Note that transistors provided in a standard cell having a logical function are not limited to fin FETs, but may be nanosheet transistors, for example. A nanosheet transistor has one nanosheet or a set of nanosheets extending in the X direction, and a source and a drain are formed on both sides of the nanosheet or the set of nanosheets. The nanosheet or the set of nanosheets serves as the channel portion of the nanosheet transistor.

According to the present disclosure, in a semiconductor integrated circuit device, many buried signal lines can be provided without causing an increase in area. The present disclosure is therefore useful for reduction in the size of the semiconductor integrated circuit device, for example.

The invention claimed is:

1. A semiconductor integrated circuit device comprising a plurality of standard cells arranged in a first direction in plan view, wherein the plurality of standard cells include a first standard cell having a logical function and including a transistor having a channel portion extending in the first direction and a gate extending in a second direction perpendicular to the first direction and intersecting the channel portion in the plan view, and a second standard cell including a signal line placed to extend in the first direction, and the signal line is formed in a buried interconnect layer, and has an overlap with the channel portion at a position in the second direction.

2. The semiconductor integrated circuit device of claim 1, wherein the plurality of standard cells include a power line extending in the first direction, formed in the buried interconnect layer.

3. The semiconductor integrated circuit device of claim 1, wherein the channel portion is a fin.

4. The semiconductor integrated circuit device of claim 1, wherein the channel portion is a nanosheet.

5. The semiconductor integrated circuit device of claim 1, wherein the plurality of standard cells include a first power line supplying a first power voltage and a second power line supplying a second power voltage, the first and second power lines extending in the first direction, formed in the buried interconnect layer, and in the first standard cell, the channel portion is provided between the first power line and the second power line and is spaced from the first and second power lines in plan view.

6. The semiconductor integrated circuit device of claim 5, wherein in the second standard cell, no channel portion is provided between the first power line and the second power line.

* * * * *